United States Patent
Gailus et al.

(10) Patent No.: US 6,520,248 B2
(45) Date of Patent: Feb. 18, 2003

(54) HEAT SINK HAVING BONDED COOLING FINS

(75) Inventors: David W. Gailus, Merrimack, NH (US); Francis Edward Fisher, Swindon (GB); Julian Ralph Cavalot, Swindon (GB)

(73) Assignee: Aavid Thermalloy LLC, Concord, NH (US)

( * ) Notice: Subject to any disclaimer, the term of this patent is extended or adjusted under 35 U.S.C. 154(b) by 34 days.

(21) Appl. No.: 09/859,715

(22) Filed: May 17, 2001

(65) Prior Publication Data

US 2002/0005248 A1 Jan. 17, 2002

Related U.S. Application Data

(60) Provisional application No. 60/205,062, filed on May 18, 2000.

(51) Int. Cl.[7] ................................................. H05K 7/20
(52) U.S. Cl. ...................... 165/80.3; 165/185; 361/704
(58) Field of Search ........................... 165/80.3, 185; 361/704, 710; 174/16.3; 29/890.03

(56) References Cited

U.S. PATENT DOCUMENTS

| | | | | |
|---|---|---|---|---|
| 5,038,858 A | * | 8/1991 | Jordan et al. | 165/185 |
| 5,542,176 A | * | 8/1996 | Serizawa et al. | 165/185 |
| 5,554,240 A | | 9/1996 | Toy | 156/83 |
| 5,819,407 A | * | 10/1998 | Terada | 29/521 |
| 6,009,938 A | * | 1/2000 | Smith et al. | 165/185 |

FOREIGN PATENT DOCUMENTS

| | | | | |
|---|---|---|---|---|
| DE | 2502472 A1 | * | 7/1976 | H01L/23/36 |
| EP | 789396 A2 | * | 12/1996 | H01L/23/367 |
| JP | 08186201 A | * | 7/1996 | H01L/23/36 |
| JP | 10-322067 A | * | 12/1998 | H05K/7/20 |

* cited by examiner

Primary Examiner—Allen Flanigan
(74) Attorney, Agent, or Firm—Cohen, Pontani, Lieberman & Pavane

(57) ABSTRACT

A heat sink has a surface with a plurality of slots having mutually facing sidewalls which converge toward the base of the slot at an angle. Each slot receives an end portion of a cooling fin having sidewalls which converge at the same angle, so that the sidewalls of the slot are at least substantially parallel to the sidewalls of the cooling fin. The slots are preferably machined in the base and the sidewalls on the fins are machined or coined, yielding tolerances which are so close that the gap between parts is less than 60 microinches, and unfilled adhesive can be used. The thinness of the bond provides good thermal conductivity and reduced curing time. It is also possible to, provide the slots with a slightly smaller angle so that the base deforms to accommodate the cooling fin and adhesive may be eliminated.

26 Claims, 2 Drawing Sheets

Process Flow for Conventional Bonded Fin Manufacturing

Process Flow for Tapered Fin Manufacturing

HEAT SINK HAVING BONDED COOLING FINS

This application claims priority from U.S. Provisional Application Ser. No. 60/205,062 filed May, 18, 2000.

BACKGROUND OF THE INVENTION

1. Field of the Invention

The present invention relates to heat sinks having cooling fins with end portions which are bonded into slots provided in a base. The present invention also relates to a process for manufacturing heat sinks of this type.

2. Description of the Related Art

Heat sinks having bonded cooling fins generally have rectangular slots extruded into a base, and rectangular fin stock prepared for bonding by abrasive blasting or etching. To aid assembly there is a slight lead-in chamfer at the top of each slot. Thermal conductivity between the fin and the base is maximized by using an adhesive filled with conductive particles, e.g. epoxy filled with aluminum. Since the bond is achieved using an adhesive filled with conductive particles, a minimum gap is needed between the fin and slot wall to prevent the adhesive from being wiped off during insertion of the fin into the slot. This gap is preferably between 0.002 and 0.005 inches or more.

FIG. 1 shows a heat sink according to the prior art, including a base 10 having a rectangular slot 12 with parallel sidewalls 13, and a cooling fin 15 having a rectangular end portion with parallel sidewalls 17. The gap between the cooling fin and the slot is filled with adhesive (not shown).

U.S. Pat. No. 5,554,240 discloses a cooling fin having a tapered plug which is received in a tapered slot machined in a base. The upper thickness of the plug is less than the upper width of the slot, and the plug is tapered with a greater angle than the slot, so that the plug is received in the slot with clearance. This clearance is occupied by particle filled adhesive which is cured while the plug is held in the slot under high pressure.

SUMMARY OF THE INVENTION

The present invention is directed to a heat sink including a base having a surface with at least one slot therein, the slot having a pair of mutually facing sidewalls which converge toward each other from the surface to form an angle, and a cooling fin having an end portion received in each slot. The end portion has an end and a pair of mutually opposed sidewalls which converge toward each other toward the end to form the same angle, whereby the mutually opposed sidewalls of the cooling fin are at least substantially parallel to respective mutually facing sidewalls of the slot. The angle is preferably in the range of 5 to 25 degrees.

The key dimensions to control are the convergence angles of the fin and slot, the straightness of the fin, the linearity of the slot, and within-part dimensional uniformity of the slots and fins. Slot depth, slot width, and fin thickness are of lesser importance since they result in fin height variation, which generally has a liberal tolerance. In a typical application, the slot depth might be 0.100 inches. If the convergence angle is 20 degrees, a slot width variation of 0.003 inches will change the fin height by 0.010 inches, which is less than half the traditional design tolerance.

According to a preferred embodiment, a particle free adhesive is used to bond the end portion of the fin to the slot. Use of an unfilled adhesive such as an anaerobic acrylic adhesive not only provides a thinner bond thickness and improved thermal conductivity, but also reduces the cure time and dwell time of the insertion force used to insert the end portion of the fin into the slot. If sufficient force is used to insert the end portion of the cooling fin into the slot, the bond gap can be reduced to the scale of the interfering surface asperities or less. If the surface finish of each part is 30 microinches RA (roughness absolute), the resulting gap could be less than 60 microinches total. This gives a bond that is 50 to 100 times thinner than the current design. Since the thermal resistance of the bond is proportional to its thickness, this reduced gap results in improved thermal performance. With appropriate slot geometry and insertion force, it is also possible to eliminate the use of adhesive altogether.

The slots are preferably machined into the base at a predetermined pitch, i.e., spacing between adjacent slots. This spacing may be uniform across the width of the base, but need not be. Use of horizontal CNC (computer numerical control) mills or high RPM vertical CNC milling machines to create bases from standard shape bar stock permits slot width tolerance control roughly 10 times greater than the slot width tolerance of extruded slots, and 100 times the tolerance control in slot-to-slot spacing on wider shapes. Not only do these improved tolerances make the process more conducive to automation, they allow a closely controlled adhesive bond line thickness. The combination with a precisely machined fin edge provides equivalent or better performance than prior art bonded fins. Manufacturing advantages include self-fixturing, fast cure time, reduced product lead-time (as compared to custom extrusions), and lower tooling costs. These can offset the cost of machining.

Fixtures for holding fins to be inserted in extruded bases are typically made by slicing a piece of the extrusion; this assures that the tolerances will be the same. Since a machining process sets the slot-to-slot pitch with greater accuracy, standard fixtures can be used instead of fixtures made from the extrusion itself. This permits fixture production in parallel (as opposed to in series) with the base production.

The invention provides an essentially flush fit between the end portions of the cooling fins and the sidewalls of the slots. This is accomplished by configuring the mating features such that one final dimension of the assembly is allowed to "float" so that the tapered fin to base joint can naturally "find" its minimum gap.

Both the slots and the end portions of the cooling fins can be made with substantially the same angles of convergence, or the slot can be formed with a slightly smaller angle of convergence so that it deforms to accommodate the cooling fin and assumes the same angle. This deformation can be elastic, where the sidewalls of the slot deform elastically to conform to the end portion of the cooling fin, or plastic, where the material of the base locally yields to conform to the end portion of the cooling fin. Deformation of the base or the fin reduces the sensitivity to variations in the convergence angles of the fin and the slot.

The slots in the base can be provided with mutually facing sidewalls which both converge toward a central axis which is perpendicular to the surface of the base. Likewise the mutually opposed sidewalls of the end portion of the cooling fin can both converge toward a central axis of the cooling fin, each side converging at a preferred angle in the range of 2.5 to 12.5 degrees. However there are certain inherent advantages in having only one sidewall of the cooling fin converge toward the central axis of the fin, a so-called "single side taper". These advantages include the possibility of coining the end portion of the cooling fin in a press tool, instead of machining both sides. Where the slot is also provided with a single side taper, the non-converging sidewall of the slot provides a datum face, and the cooling fin is self guiding during insertion. Insertion is also easier due to improved adhesive flow, avoiding hydraulic lock as excessive adhesive is squeezed out. For a single side taper, the preferred convergence is in the range of 5 to 15 degrees.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings:

FIG. 2 depicts a heat sink base and fin bonding technique in accordance with the present invention;

DETAILED DESCRIPTION OF THE PRESENTLY PREFERRED EMBODIMENTS

Figure 1:
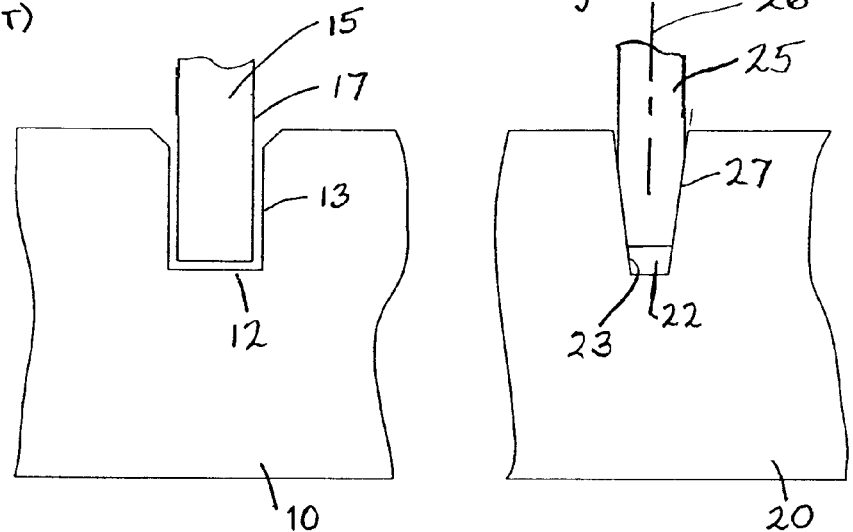
FIG. 1 depicts a prior art heat sink base and fin bonding technique.

Referring to FIG. 2, the heat sink according to the invention includes a metal base 20 provided with a slot 22 having mutually facing sidewalls 23, and a cooling fin 25 having an end portion with mutually opposed sidewalls 27 received in the slot. The heat sink will generally have a plurality of side by side slots which receive a respective plurality of side by side fins, but only one such pair is shown here for simplicity.

According to the invention, the mutually facing sidewalls 23 of the slot 22 converge toward each other from the surface of the base at an acute angle, preferably between 5 and 25 degrees. The mutually opposed sidewalls 27 of the cooling fin 25 converge toward each other toward the end at the same angle, whereby the mutually opposed sidewalls 27 are at least substantially parallel to the mutually facing sidewalls 23 of the slot. If the straightness of the fin, slot linearity, and dimensional uniformity are within design tolerances, the gap between the parts can be on the same scale as the interfering surface asperities of the parts, or less than 60 microinches. This permits the use of a very thin layer of adhesive such as an anaerobic acrylic adhesive or a hot melt adhesive such as thermoplastic polyimide.

In the embodiment of FIG. 2 the sidewalls 23 of the slot both converge toward a centerline which is perpendicular to the surface of the base 20. However it is also possible for the slots to be formed with centerlines at some other angle to the surface, even 45 degrees. The cooling fin is shown with sidewalls 27 which both converge toward the centerline 26 of the cooling fin. The sidewalls 26 can be formed by machining both sides of the end portion of the cooling fin, or by coining both sides.

The base may be manufactured by precision sawing of bar stock, and using a horizontal milling machine or a high speed spindle vertical CNC mill to machine the slots. The slots are then deburred, etched, and inspected using CMM (coordinate measuring machine). The cooling fins may be manufactured by slitting the sheet using a coil slitter to form a strip, straightening the strip, milling or skiving the edge of the strip, and inspecting the strip using a line-line visual inspection device, off-line comparator, laser micrometer, or air gauging. The strip is then cut using an in-line shear to produce the individual fins, the fins are deburred and cleaned, and inspected using CMM, comparator, or dedicated gauging.

Figure 3:
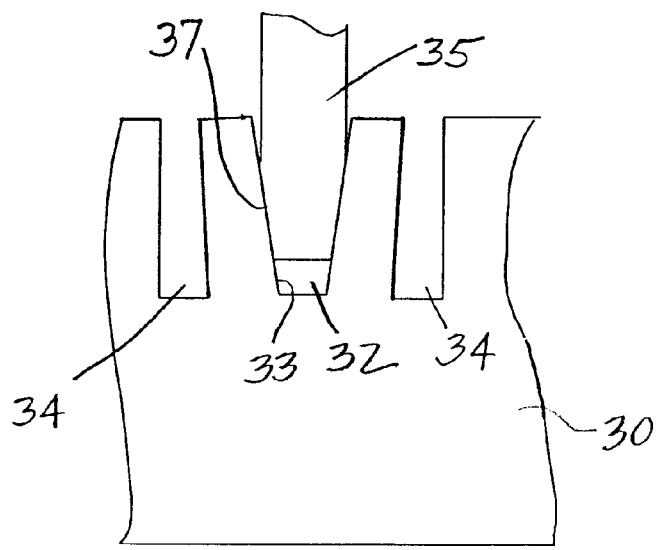
FIG. 3 depicts a heat sink base and fin bonding technique in accordance with another embodiment of the present invention.

FIG. 3 shows an embodiment wherein the base 30 has a slot 32 with mutually facing sidewalls 33 which converge toward each other from the surface of the base at an angle, for example 20 degrees. In the assembled form, the sidewalls 37 of the end portion of the cooling fin 35 converge at the same angle, once again making possible the uniformly narrow gap. However the taper of the slot is less than the taper of the cooling fin prior to assembly, i.e. the mutually facing sidewalls 33 are manufactured with a smaller convergence angle than the mutually opposed sidewalls 37. The auxiliary slots 34 on either side of the slot 32 provide resilience to the sidewalls 33 so that the slot 32 deforms elastically to accommodate the end portion of the cooling fin 35, thereby rendering the convergence angles identical. This resilient deformation also allows for some variation in the angles as manufactured, and further provides additional retention of the cooling fin. Note that the slots 34 originally have a rectangular profile which is rendered trapezoidal by insertion of the cooling fin.

In a further embodiment, similar to that of FIG. 3 but not shown, the slot is again provided with a smaller taper than the cooling fin, and the deformation during insertion is plastic. That is, the material in the mutually facing sidewalls of the slot locally yields during insertion to accommodate the end portion of the cooling fin. This may be achieved by making the cooling fin of a metal which is harder than the metal of the base, e.g. by utilizing two different alloys of aluminum. Once again the angle tolerances are not so critical and (with properly chosen slot geometry and materials) it may be possible to eliminate the adhesive.

Figure 4:
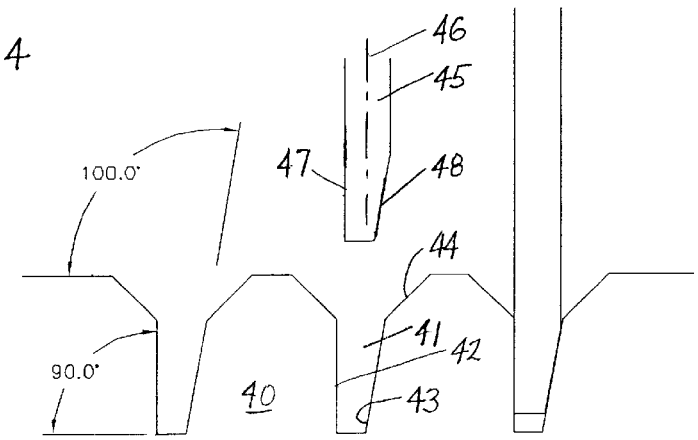
FIG. 4 depicts an embodiment with a taper on only one side of the fins and slots.

FIG. 4 shows an especially preferred embodiment wherein both the slot and the cooling fin exhibit a "single-sided taper". The base 40 is provided with slots 41, each slot 41 having a first sidewall 42 which is normal to the surface of the base, and a second sidewall 43 which converges from the surface toward a central axis of the slot 41. The second sidewall 43 shown here is in a plane canted at 100 degrees to the surface of the base 40, and therefore converges toward the central axis of the slot, as well as the first sidewall 42, at an angle of 10 degrees. The cooling fin 45 has an end portion with a first sidewall 47 which is parallel to the central axis 46 of the cooling fin, and a second sidewall 48 which converges toward that axis, here at an angle of 10 degrees. The inserted fin therefore achieves a close fit, the mutually facing sidewalls 42, 43 of the slot 41 being at least substantially parallel to respective mutually opposed sidewalls 47, 48 of the fin 45. Fin orientation into the base is necessary, but this can easily be incorporated into an automated manufacturing/assembly process. Having one side of the slot normal to the surface provides a datum face and therefore better quality control. The fin is always pushed toward this datum face instead of centralizing in the groove As mentioned above, very good tolerances can be achieved by machining the slots into the base. However it is also possible to extrude the base with acceptable tolerance limits which yield a good assembly joint. It is also possible to use high thermal conduction adhesives which are filled with metal oxides. The gap is limited only by the size of the particles and is typically 0.001 to 0.002 inches, which is less than the prior art gap and gives a 30–50% improvement in heat transfer across the joint.

Figure 5:
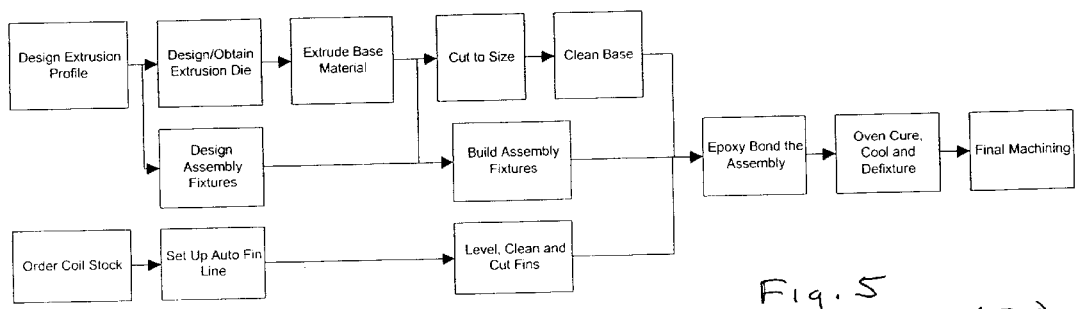
FIG. 5 depicts a flow chart for a prior art heat sink manufacturing process.
Figure 6:
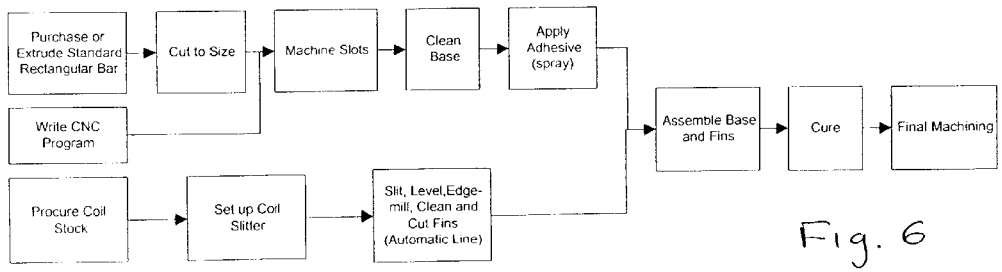
FIG. 6 depicts a flow chart for a manufacturing process in accordance with the present invention.

The process according to the invention depends on process control of a few easily measured variables, thus resulting in a process that can be easily monitored, controlled and reproduced. A comparison of the manufacturing process of the prior art with a preferred manufacturing process according to the invention is illustrated in the flow diagrams of FIGS. 5 and 6.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A heat sink comprising:
    a base having a surface with at least one slot therein, said slot having a pair of mutually facing sidewalls which converge toward each other from said surface to form an angle between said mutually facing sidewalls; and
    a cooling fin having an end portion received in each said slot, said end portion having an end and a pair of mutually opposed sidewalls which converge toward said end to form said angle between said mutually opposed sidewalls, whereby said mutually opposed sidewalls are at least substantially parallel to and at least partially coextensive with respective said mutually facing sidewalls.

2. A heat sink as in claim 1, wherein each of said mutually facing sidewalls is separated from a respective one of said mutually opposed sidewalls by a gap of less than 60 microinches.

3. A heat sink as in claim 2, further comprising an adhesive in said gap.

4. A heat sink as in claim 3, wherein said adhesive is one of an anaerobic adhesive and a hot melt adhesive.

5. A heat sink as in claim 1, wherein each of said mutually facing sidewalls is separated from a respective one of said mutually opposed sidewalls by a gap of less than 0.002 inches.

6. A heat sink as in claim 5, wherein said adhesive is filled with thermally conductive particles.

7. A heat sink as in claim 1, wherein said cooling fin is made of a material which is harder than the material of said base, said base being plastically deformed so that the mutually facing sidewalls of the slot assume the same angle as the mutually opposed sidewalls of the cooling fin during insertion of the end portion into the slot.

8. A heat sink as in claim 1, wherein said sidewalls of said slot are elastically deformable to assume the same angle as the mutually opposed sidewalls of the cooling fin during insertion of the end portion into the slot.

9. A heat sink as in claim 8, further comprising an auxiliary slot on each side of each said at least one slot, said auxiliary slots providing elasticity of said mutually facing sidewalls.

10. A heat sink as in claim 1, wherein said slot has a central axis which is normal to the surface, each of said mutually facing sidewalls converging toward said central axis.

11. A heat sink as in claim 1, wherein said cooling fin has a central axis, each of said mutually opposed sidewalls converging toward said central axis.

12. A heat sink as in claim 1, wherein said slot has a central axis, only one of said mutually facing sidewalls converging toward said central axis.

13. A heat sink as in claim 1, wherein said cooling fin has a central axis, only one of said mutually opposed sidewalls converging toward said central axis.

14. A heat sink as in claim 13, wherein said one of said mutually opposed sidewalls is formed by coining.

15. A heat sink as in claim 1, wherein said angle is 5 to 25 degrees.

16. A method of manufacturing a heat sink, said method comprising the following steps:
    providing a base having a surface with at least one slot therein, said slot having a pair of mutually facing sidewalls;
    providing at least one cooling fin having an end portion with an end and a pair of mutually opposed sidewalls which con verge toward said end to form an angle between said mutually opposed sidewalls; and
    inserting said end portion into said slot so that said mutually opposed sidewalls of said end portion are at least substantially parallel to and at least partially coextensive with respective said mutually facing sidewalls of said slot.

17. A method as in claim 16, wherein said mutually facing sidewalls converge toward each other to form said angle between said mutually facing sidewalls prior to inserting said end portion into said slot, whereby said end portion of said cooling fin can be inserted between said mutually facing sidewalls of said slot without deforming said sidewalls of said slot.

18. A method as in claim 16, wherein said cooling fin is made of a material which is harder than the material of said base, said mutually facing sidewalls converging at less than said angle prior to insertion of said end portion, said base being plastically deformed during insertion of the end portion into the slot so that the mutually facing sidewalls of the slot assume the same angle as the mutually opposed sidewalls of the cooling fin.

19. A method as in claim 16, wherein said mutually facing sidewalls of said slot converge at an angle which is smaller than said angle between said mutually opposed sidewalls of said end portion, said base deforming elastically during insertion of said end portion into said slot so that said mutually opposed sidewalls of said end portion are at least substantially parallel to respective said mutually facing sidewalls of said slot.

20. A method as in claim 16, wherein said base is provided by machining a plurality of said slots into a piece of bar stock side by side with a predetermined pitch.

21. A method as in claim 16, wherein said cooling fin is provided by cutting from one of bar stock and coil stock, then machining the end portion to produce said at least one of said mutually opposed sidewalls.

22. A method as in claim 16, wherein said cooling fin is provided by cutting from one of bar stock and coil stock, then coining the end portion so that at least one of said mutually opposed sidewalls converges toward a central axis of said cooling fin.

23. A method as in claim 22, wherein said end portion is coined so that only one of said mutually opposed sidewalls converges toward aid central axis.

24. A method as in claim 16, wherein said angle is 5 to 25 degrees.

25. A method as in claim 16, wherein said base is provided by extruding said base with at least one slot therein, said end portion being inserted into said slot so that each of said mutually facing sidewalls is separated from a respective one of said mutually opposed sidewalls by a gap of 0.001 to 0.002 inches, said gap being filled with an adhesive filled with conductive particles.

26. A method as in claim 16, further comprising applying an adhesive to one of said slot and said end portion prior to inserting said end portion into said slot.

* * * * *